(12) United States Patent
O (10) Patent No.: US 7,512,026 B2
(45) Date of Patent: Mar. 31, 2009

(54) SENSE AMPLIFYING CIRCUIT CAPABLE OF OPERATING WITH LOWER VOLTAGE AND NONVOLATILE MEMORY DEVICE INCLUDING THE SAME

(75) Inventor: Se-Eun O, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 11/606,291

(22) Filed: Nov. 30, 2006

(65) Prior Publication Data
US 2008/0089122 A1    Apr. 17, 2008

(30) Foreign Application Priority Data
Oct. 16, 2006    (KR) ...................... 10-2006-0100514

(51) Int. Cl.
    *G11C 7/02* (2006.01)
(52) U.S. Cl. ............... 365/207; 365/185.2; 365/185.21; 365/189.07
(58) Field of Classification Search ............... 365/185.2, 365/185.21, 189.07, 207, 210.1
See application file for complete search history.

(56) References Cited

U.S. PATENT DOCUMENTS

| | | | | |
|---|---|---|---|---|
| 6,445,616 | B2 * | 9/2002 | Kim ........................ | 365/185.2 |
| 6,469,929 | B1 | 10/2002 | Kushnarenko et al. | |
| 6,775,186 | B1 * | 8/2004 | Eshel ..................... | 365/185.21 |
| 6,795,350 | B2 * | 9/2004 | Chen et al. ............. | 365/189.07 |
| 2001/0012228 | A1 | 8/2001 | Perner | |
| 2006/0023518 | A1 | 2/2006 | Iwata | |

FOREIGN PATENT DOCUMENTS

| | | |
|---|---|---|
| JP | 07-135452 | 5/1995 |
| JP | 07-287988 | 10/1995 |
| JP | 2003-051192 | 2/2003 |
| JP | 2005-209304 | 8/2005 |

OTHER PUBLICATIONS

Korean Notice to Submit Response to an Office Action dated Nov. 23, 2007 (with English translation).

* cited by examiner

*Primary Examiner*—Pho M. Luu
*Assistant Examiner*—Toan Le
(74) *Attorney, Agent, or Firm*—Harness, Dickey & Pierce, PLC (57) ABSTRACT

A sense amplifying circuit capable of operating with a lower voltage and/or a nonvolatile memory device including the same may be provided. The nonvolatile memory device may include a nonvolatile memory cell array including a first bit line connected with a first memory cell and/or a second bit line connected with a first reference memory cell, and/or a sense amplifying circuit configured to sense data stored in the first memory cell based on a current flowing in the first bit line and/or a current flowing in the second bit line. The sense amplifying circuit may include a first comparator comparing a bit line voltage with a first reference voltage and/or outputting a first comparison signal, a second comparator comparing a reference bit line voltage with a second reference voltage and/or outputting a second comparison signal, a first load transistor operating based on the first comparison signal, a second load transistor operating based on the second comparison signal, and/or a sense amplifier sensing the data stored in the first memory cell based on the first comparison signal and/or the second comparison signal.

22 Claims, 10 Drawing Sheets

SENSE AMPLIFYING CIRCUIT CAPABLE OF OPERATING WITH LOWER VOLTAGE AND NONVOLATILE MEMORY DEVICE INCLUDING THE SAME

PRIORITY STATEMENT

This application claims the benefit of priority to Korean Patent Application No. 10-2006-0100514, filed on Oct. 16, 2006, in the Korean Intellectual Property Office, the entire contents of which is incorporated herein in its entirety by reference.

BACKGROUND

1. Field

Example embodiments relate to a sense amplifying circuit, and for example, to a sense amplifying circuit for a nonvolatile memory device.

2. Description of Related Art

Examples of conventional nonvolatile memory devices may be mask read only memory (ROM), electrically erasable and programmable read only memory (EEPROM), and/or erasable and programmable read only memory (EPROM). EEPROM has been widely used for system programming requiring continuous update or as an auxiliary memory device. For example, flash EEPROM (hereinafter, referred to as a flash memory device) having a higher degree of integration than normal EEPROM may be very advantageous as a large-capacity auxiliary memory device. Flash memory devices may largely be divided into NAND flash memory devices, NOR flash memory devices, and/or AND flash memory devices. NAND flash memory devices may have a higher degree of integration and may usually be used to store data. NOR flash memory devices may have a higher data access speed and may be used to store program codes.

Figure 1:
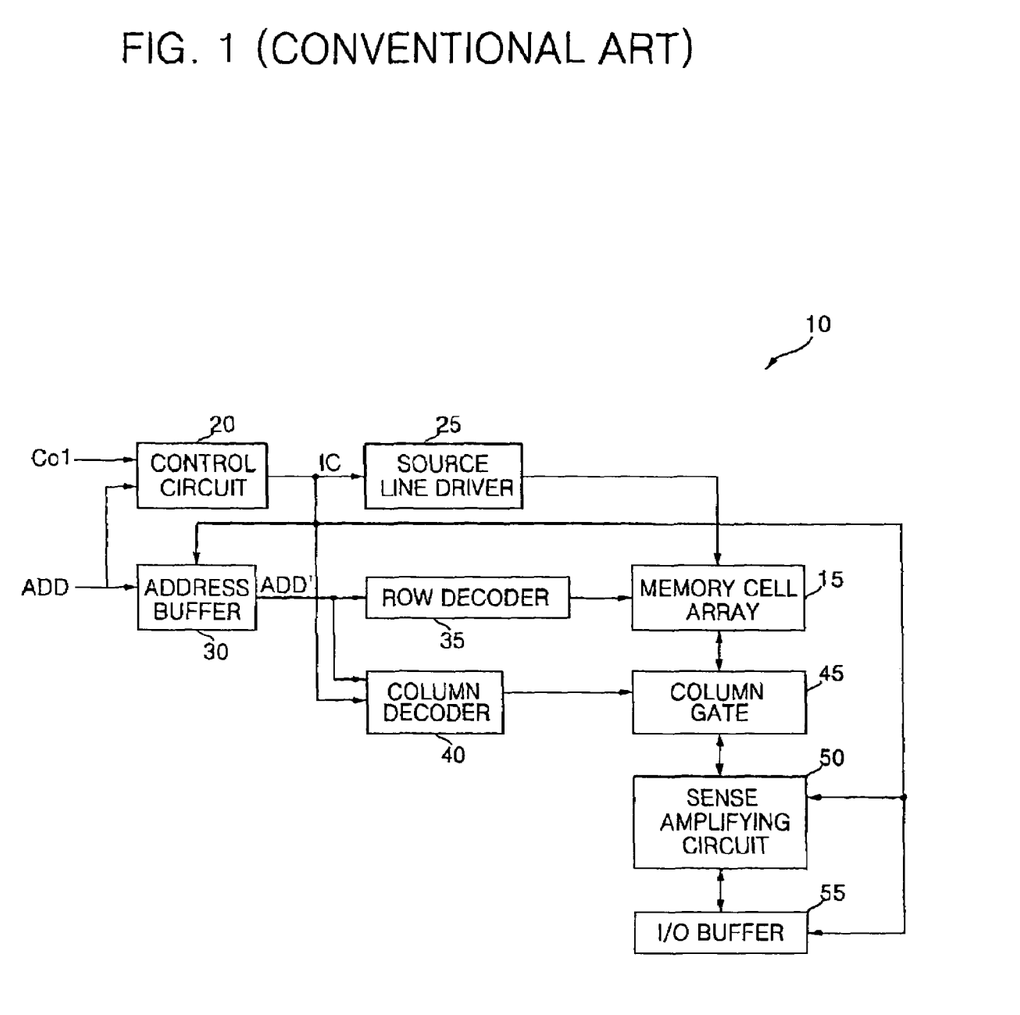
FIG. 1 is an example block diagram of a conventional NOR-type nonvolatile memory device.

FIG. 1 is a block diagram of a conventional NOR-type nonvolatile memory device 10, e.g., a NOR flash memory device. Referring to FIG. 1, the nonvolatile memory device 10 may include a memory cell array 15, a control circuit 20, a source line driver 25, an address buffer 30, a row decoder 35, a column decoder 40, a column gate 45, a sense amplifying circuit 50, and/or an input/output (I/O) buffer 55.

The memory cell array 15 may include a plurality of memory cells each implemented by a MOS transistor including a floating gate and/or a control gate. A drain of the MOS transistor may be connected with a bit line and/or a source thereof may be connected with a common source line. For example, when electrons are injected into the floating gate and a threshold voltage is increased, data "0" may be stored in each memory cell. When electrons escape from the floating gate and the threshold voltage is decreased, data "1" may be stored in the memory cell. A memory cell having the increased threshold voltage may be referred to as a programmed cell or an off-cell while a memory cell having the decreased threshold voltage may be referred to as an erased cell or an on-cell.

The control circuit 20 may generate an internal control signal IC corresponding to an operating mode of the nonvolatile memory device 10 based on an external control signal Co1.

The source line driver 25 may control a voltage of the common source line connected with the memory cells based on the internal control signal IC according to a desired or predetermined operating mode (e.g., a read-out mode). For example, the source line driver 25 may set a ground voltage on the common source line in the read-out mode.

The address buffer 30 may buffer an external address ADD and may output an internal address ADD', e.g., a row address and a column address, to the row decoder 35 and/or the column decoder 40 based on the internal control signal IC.

The row decoder 35 may select a word line connected with memory cells based on the internal control signal IC and the row address.

The column decoder 40 and/or the column gate 45 may select a bit line connected with memory cells based on the internal control signal IC and/or the column address.

The sense amplifying circuit 50 may sense data of a memory cell connected with both of the selected word line and the selected bit line and/or may amplify the sensed data.

The I/O buffer 55 may buffer an output of the sense amplifying circuit 50 and/or may output a buffered signal to an I/O terminal in response to the internal control signal IC.

As nonvolatile memory devices have higher capacity and/or become thinner, the development of nonvolatile memory devices capable of operating with lower voltage has been demanded.

During a read operation in a nonvolatile memory device, it may be important to reduce a swing width of a bit line voltage of a memory cell in order to increase a read speed, secure stable current for the memory cell, and/or prevent disturbance, e.g., a data error in the memory cell. FIGS. 2 through 5 illustrate conventional sense amplifying circuits for a nonvolatile memory device.

Figure 2:
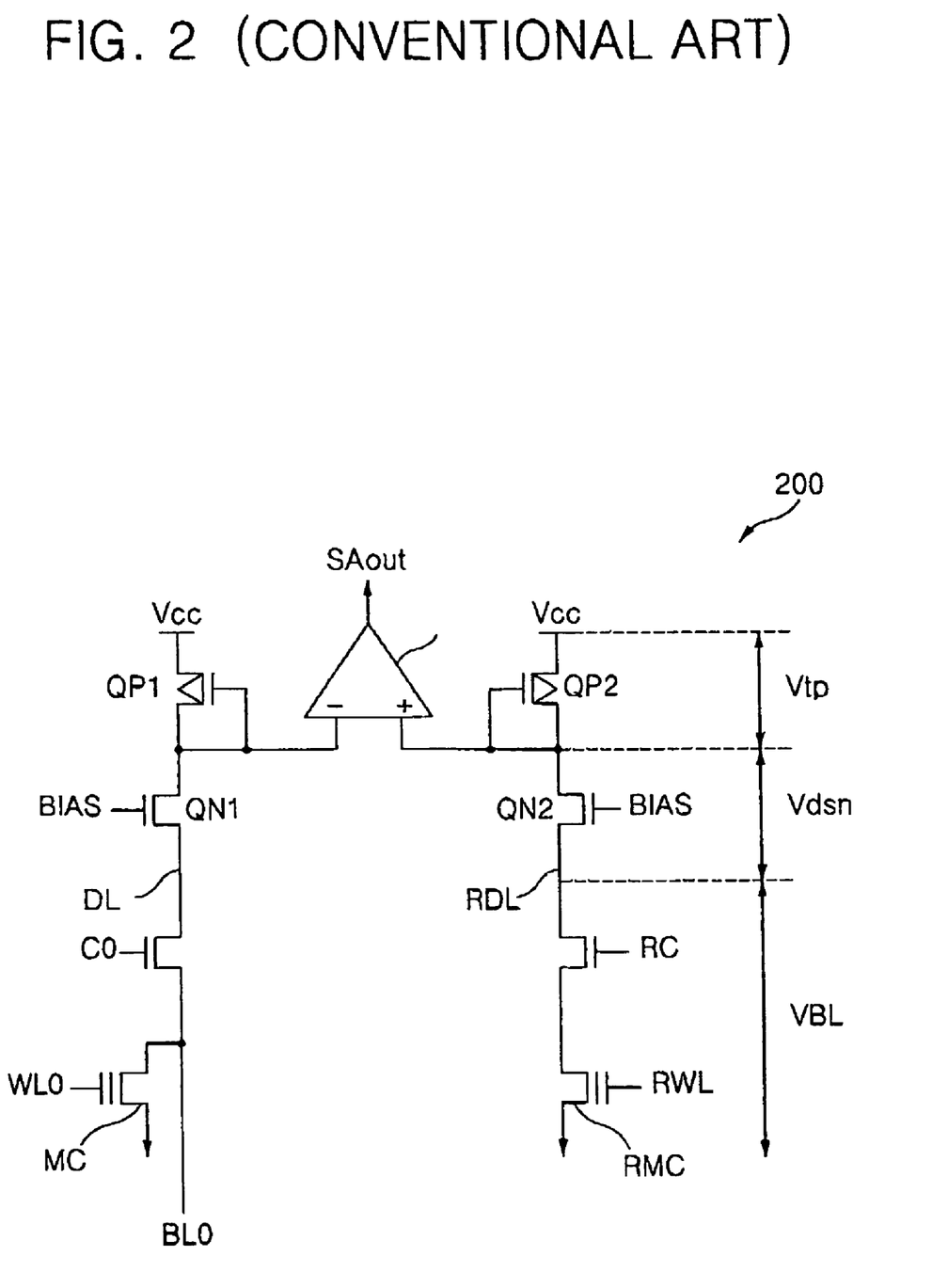
FIGS. 2 through 5 illustrate example conventional sense amplifying circuits for a conventional nonvolatile memory device.
Figure 3:
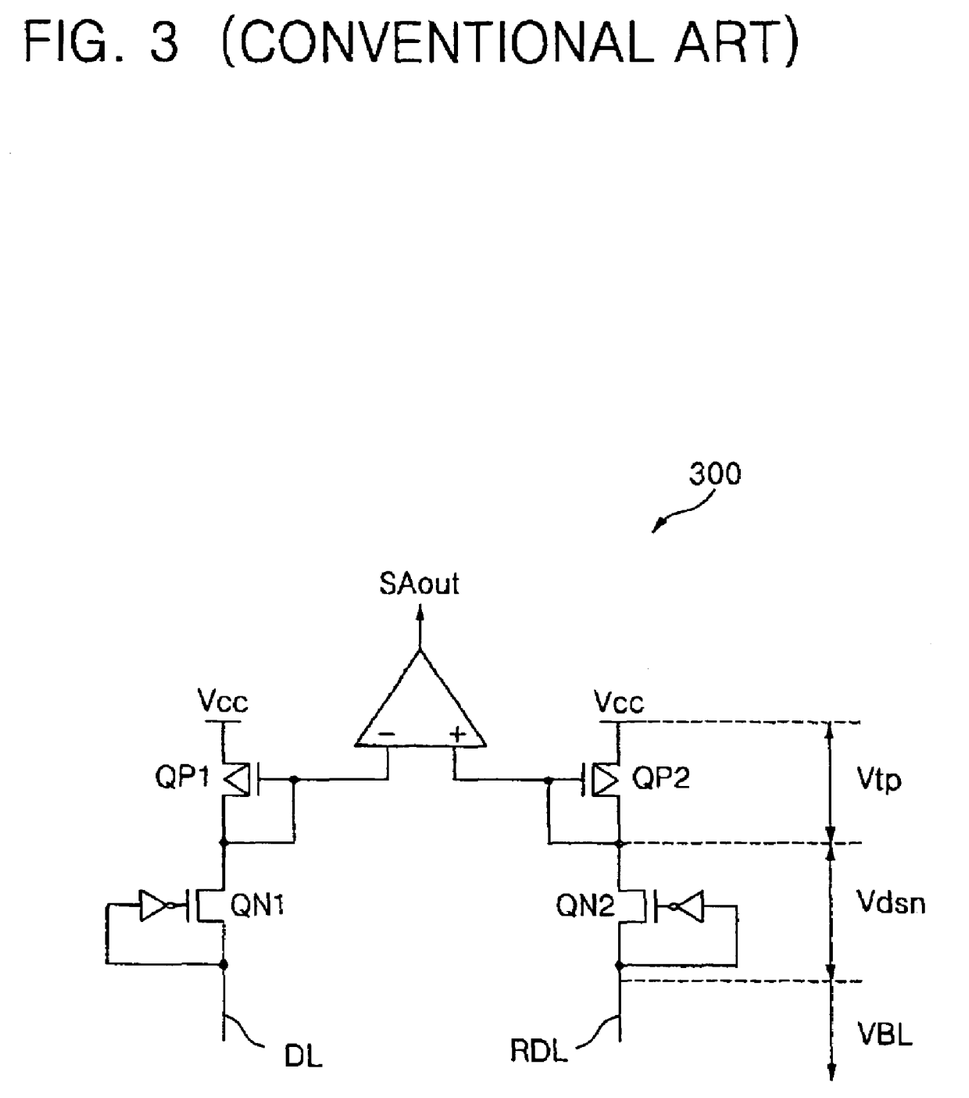

A conventional sense amplifying circuit 200 or 300 illustrated in FIG. 2 or 3 needs a power supply voltage Vcc of at least 1.2 V in order to realize normal clamping of a bit line voltage VBL by a first transistor QN1 or QN2, which may be connected between a load transistor QP1 or QP2 of a sense amplifier 210 or 310 and a data line DL or a reference data line RDL, respectively. The data line DL may be selectively connected with a bit line BL0 and the reference data line RDL may be a signal line selectively connected with a reference bit line. For example, the sum of voltages, e.g., Vtp of 0.5 V, Vdsn of 0.2 V, and/or VBL of 0.5 V, respectively needed for the load transistor QP2, the first transistor QN2, and/or the reference data line RDL is 1.2 V, and the power supply voltage Vcc needs to be at least 1.2 V. Accordingly, the conventional sense amplifying circuit 200 or 300 may not operate with the power supply voltage Vcc of 1 V or less.

Figure 4:
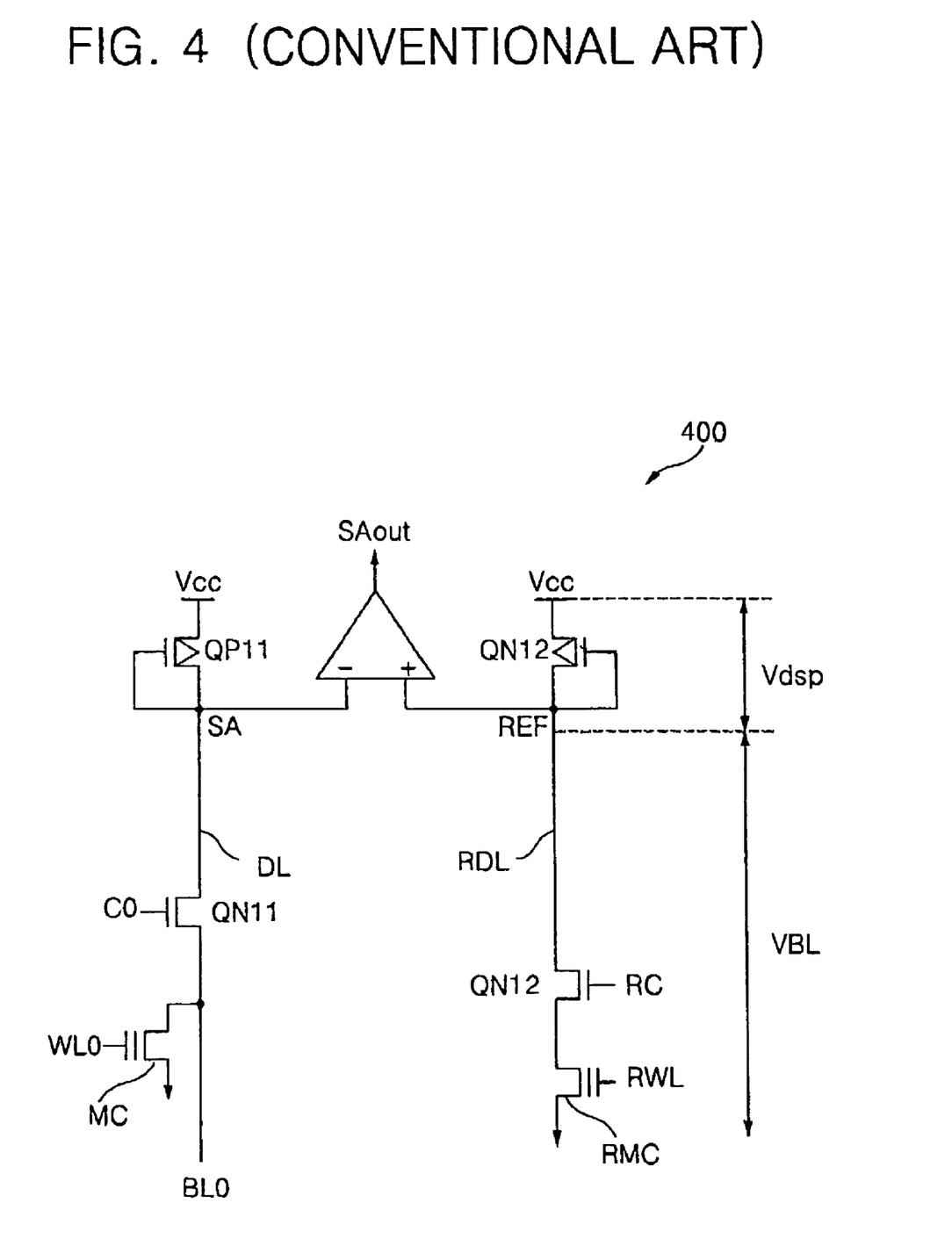

In a conventional sense amplifying circuit 400 illustrated in FIG. 4, a load transistor QP11 may serve as a load and/or serve to clamp a bit line voltage in order to decrease the power supply voltage Vcc needed to operate the sense amplifying circuit 400. For example, the power supply voltage Vcc needed to operate the conventional sense amplifying circuit 400 may be the sum of a voltage Vdsp (=0.2 V) needed for a load transistor QP12 and a voltage VBL (=0.5) needed for the reference data line RDL, i.e., Vdsp+VBL=0.7 V. Accordingly, the conventional sense amplifying circuit 400 may operate with the power supply voltage Vcc of 1 V or less.

However, because a large-capacity bit line capacitor may be directly connected with the load transistor QP11 in a higher-capacity nonvolatile memory device, the response speed of a sense terminal SA of the sense amplifying circuit 400 may be decreased and/or disturbance may occur in a memory cell MC. Time taken to read data in the nonvolatile memory device may be increased. Because the change of the power supply voltage Vcc applied to the sense amplifying circuit 400 may result in the change of the bit line voltage, stable current for a memory cell in the nonvolatile memory device may not be secured.

Figure 5:
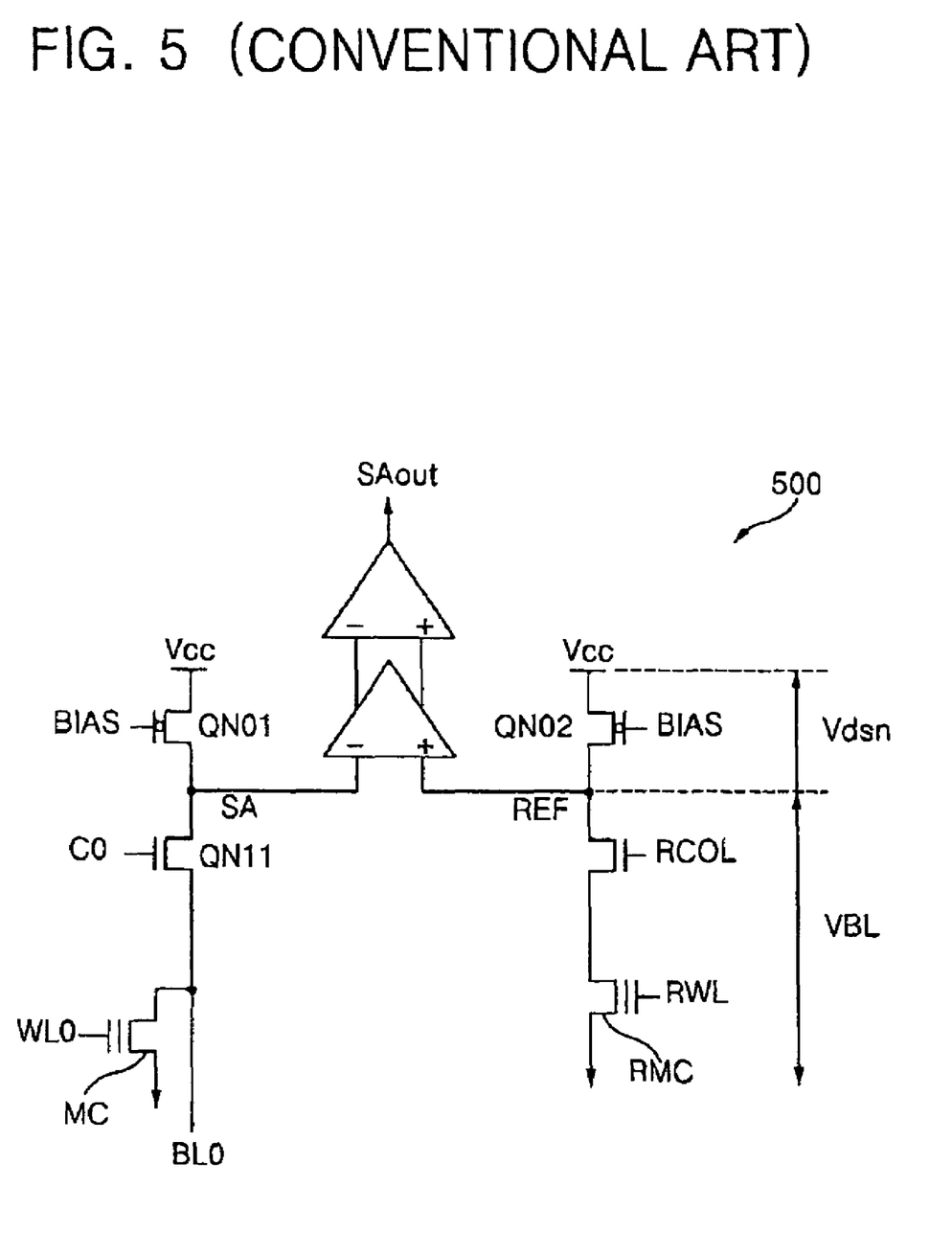

A conventional sense amplifying circuit 500 illustrated in FIG. 5 may operate with the power supply voltage Vcc of 1 V or less similar to the conventional sense amplifying circuit 400 illustrated in FIG. 4. In the conventional sense amplifying circuit 500 illustrated in FIG. 5, a bias voltage, which may not be affected by the change of the power supply voltage Vcc applied to the sense amplifying circuit 500, may be used as a gate signal of a load transistor QN01. Accordingly, the conventional sense amplifying circuit 500 may secure stable current for a memory cell in a nonvolatile memory device, thereby reducing disturbance in the memory cell. However, because a bit line may be charged with a voltage between a gate and a source of the load transistor QN01, transient response characteristics may be deteriorated and/or time taken to read data may be increased.

As described above, conventional sense amplifying circuits for a nonvolatile memory device may not operate with lower power supply voltage (e.g., 1 V), or if they operate, read speed may be decreased or disturbance may occur in a memory cell.

SUMMARY

Example embodiments may provide a sense amplifying circuit capable of operating with a power supply voltage of 1 V or less, increasing read speed, securing stable current for a memory cell, and/or removing disturbance in a memory cell, and/or a nonvolatile memory device including the sense amplifying circuit.

According to example embodiments, there may be provided a sense amplifying circuit for comparing a current flowing in a first bit line connected with a first cell with a current flowing in a second bit line connected with a second cell and/or sensing data stored in the first cell in a nonvolatile memory device. The sense amplifying circuit may include a controller configured to control the current flowing in the first bit line based on a first reference voltage and/or to control the current flowing in the second bit line based on a second reference voltage, and/or a sense amplifier configured to sense the data stored in the first cell based on the current flowing in the first bit line and/or the current flowing in the second bit line, which may be controlled by the controller.

According to an example embodiment, a sense amplifying circuit may include a controller configured to control a current flowing in a first bit line connected with a first cell based on a first reference voltage and/or to control a current flowing in a second bit line connected with a second cell based on a second reference voltage, and/or a sense amplifier configured to sense data stored in the first cell based on the current flowing in the first bit line and/or the current flowing in the second bit line.

According to an example embodiment, a nonvolatile memory device may include the sense amplifying circuit, and/or a nonvolatile memory cell array including the first bit line connected with the first cell and the second bit line connected with the second cell. The first cell may be a first memory cell and the second cell may be a first reference memory cell.

According to an example embodiment, the controller may include a bit line connection node selectively connected with the first bit line, a reference bit line connection node selectively connected with the second bit line, a first comparator configured to compare a voltage of the bit line connection node with a first reference voltage and/or to output a first comparison signal, a second comparator configured to compare a voltage of the reference bit line connection node with a second reference voltage and/or to output a second comparison signal, a first load transistor connected between a first power supply voltage and the bit line connection node and/or controlled by the first comparison signal, and/or a second load transistor connected between the first power supply voltage and the reference bit line connection node and/or controlled by the second comparison signal.

According to an example embodiment, the controller may further include a current generation circuit configured to generate a first current signal based on a voltage of the first comparison signal and/or to generate a second current signal based on a voltage of the second comparison signal. The sense amplifier may sense the data stored in the first cell based on the first current signal and/or the second current signal.

According to an example embodiment, the current generation circuit may include a first transistor connected between the first power supply voltage and a first node and/or including a gate receiving the first comparison signal, a second transistor connected between the first power supply voltage and a second node and/or including a gate receiving the second comparison signal, a third transistor connected between the first node and a second power supply voltage, and/or a fourth transistor connected between the second node and the second power supply voltage. A gate of the third transistor, a gate of the fourth transistor, and/or a drain of the fourth transistor may be connected in common. A current flowing in the first transistor may correspond to the first current signal and/or a current flowing in the second transistor may correspond to the second current signal. The sense amplifier may receive a signal from the first node.

According to an example embodiment, the sense amplifier may sense and/or amplify a voltage difference between the first comparison signal and the second comparison signal.

According to an example embodiment, the sense amplifier may sense and amplify a difference between a voltage of the bit line connection node and a voltage of the reference bit line connection node.

According to an example embodiment, each of the first and second comparators may include a first transistor connected between a first node and the first power supply voltage, a second transistor connected between the first node and a second power supply voltage, a third transistor connected between a second node and the first power supply voltage, and/or a fourth transistor connected between the second node and the second power supply voltage. A gate of the first transistor, a gate of the third transistor, and/or a drain of the third transistor may be connected in common. The first comparison signal may be output through the first node of the first comparator, a gate of the fourth transistor of the first comparator may be connected with the bit line connection node, and/or the first reference voltage may be input to a gate of the second transistor of the first comparator. The second comparison signal may be output through the first node of the second comparator, a gate of the fourth transistor of the second comparator may be connected with the reference bit line connection node, and the second reference voltage may be input to a gate of the second transistor of the second comparator.

According to an example embodiment, a nonvolatile memory device may include a nonvolatile memory cell array including a first bit line connected with a first memory cell and/or a second bit line connected with a first reference memory cell, and/or a sense amplifying circuit configured to sense data stored in the first memory cell based on a current flowing in the first bit line and/or a current flowing in the second bit line. The sense amplifying circuit may include a bit line connection node selectively connected with the first bit line, a reference bit line connection node selectively connected with the second bit line, a first comparator configured to compare a voltage of the bit line connection node with a first reference voltage and/or to output a first comparison signal, a second comparator configured to compare a voltage of the reference bit line connection node with a second reference voltage and/or to output a second comparison signal, a first load transistor connected between a first power supply voltage and the bit line connection node and/or configured to operate based on the first comparison signal, a second load transistor connected between the first power supply voltage and the reference bit line connection node and/or configured to operate based on the second comparison signal, and/or a sense amplifier configured to sense the data stored in the first memory cell based on a voltage of the bit line connection node and/or a voltage of the reference bit line connection node or the first comparison signal and/or the second comparison signal.

According to an example embodiment, a method of operating a sense amplifying circuit may include controlling a current flowing in a first bit line connected with a first cell based on a first reference voltage, controlling a current flowing in a second bit line connected with a second cell based on a second reference voltage, and/or sensing data stored in the first cell based on the current flowing in the first bit line and/or the current flowing in the second bit line.

According to an example embodiment, the method may further include comparing a voltage of a bit line connection node selectively connected with the first bit line with a first reference voltage to output a first comparison signal, comparing a voltage of a reference bit line connection node selectively connected with the second bit line with a second reference voltage to output a second comparison signal, controlling a first load transistor connected between a first power supply voltage and the bit line connection node with the first comparison signal, and/or controlling a second load transistor connected between the first power supply voltage and the reference bit line connection node with the second comparison signal.

According to an example embodiment, the method may further include generating a first current signal based on a voltage of the first comparison signal, and generating a second current signal based on a voltage of the second comparison signal, wherein the sensing of the data stored in the first cell is based on the first current signal and/or the second current signal.

According to an example embodiment, the method may further include sensing and amplifying a voltage difference between the first comparison signal and the second comparison signal.

According to an example embodiment, the method may further include sensing and amplifying a difference between a voltage of the bit line connection node and a voltage of the reference bit line connection node.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be embodied in many different forms and should not be construed as limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Reference will now be made to example embodiments, which are illustrated in the accompanying drawings, wherein like reference numerals refer to the like components throughout.

Figure 6:
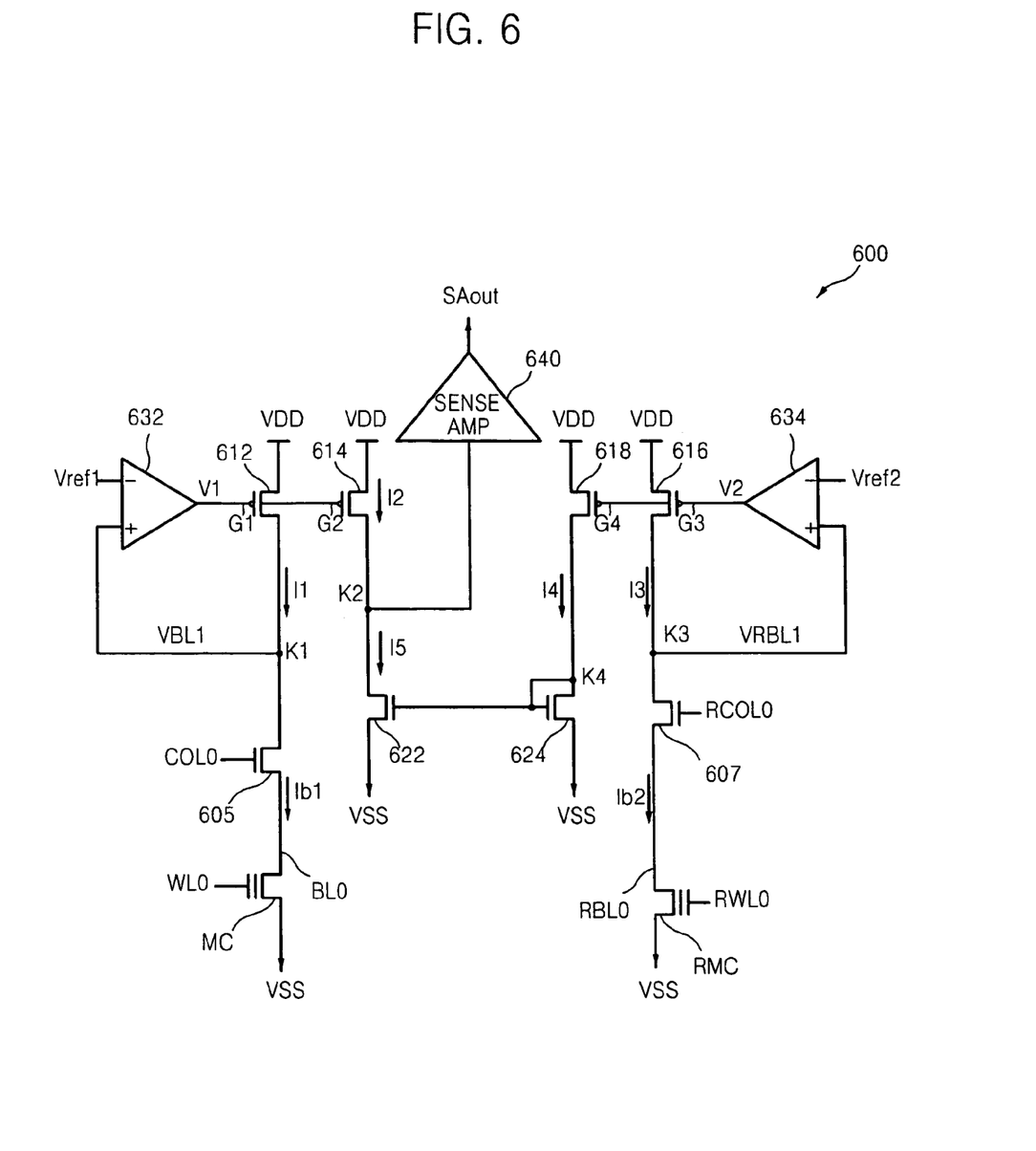
FIG. 6 illustrates a sense amplifying circuit for a nonvolatile memory device according to an example embodiment.

FIG. 6 illustrates a sense amplifying circuit 600 according to an example embodiment. In an example embodiment, the sense amplifying circuit 600 may be a sense amplifying circuit for a nonvolatile memory device. Referring to FIG. 6, the sense amplifying circuit 600 may compare a current Ib1 flowing in a first bit line, e.g., BL0, connected with a first cell MC, e.g., a memory cell, with a current Ib2 flowing in a second bit line, e.g., a reference bit line RBL0, connected with a second cell RMC, e.g., a reference memory cell, and/or sense and amplify data stored in the first cell MC. The sense amplifying circuit 600 may include a controller and/or a sense amplifier 640.

The controller may control current flowing in the first bit line based on a first reference voltage Vref1 and/or current flowing in the second bit line based on a second reference voltage Vref2. The controller may include a first comparator 632, a second comparator 634, a first load transistor 612, a second load transistor 616, a first transistor 614, a second transistor 618, and/or a current mirror (622, 624).

A first column transistor 605 and/or a first reference column transistor 607 may be selectively enabled in response to control signals COL0 and/or RCOL0, respectively, so that the first bit line BL0 may be selectively connected with a bit line connection node K1 and/or the second bit line, e.g., the reference bit line RBL0 may be selectively connected with a reference bit line connection node K3. The bit line connection node K1 may be a node on a data I/O line selectively connected with a plurality of bit lines. The reference bit line connection node K3 may be a node on a reference data I/O line selectively connected with the reference bit line RBL0.

The first load transistor 612 may include a first terminal connected with a first power supply voltage VDD, a second terminal K1 selectively connected with the first bit line BL0, and/or a first gate G1. The first transistor 614 may include a third terminal K2, a fourth terminal connected with the first power supply voltage VDD, and/or a second gate G2. The second terminal K1 may correspond to the bit line connection node.

The second load transistor 616 may include a fifth terminal connected with the first power supply voltage VDD, a sixth terminal K3 selectively connected with the second bit line RBL0, and/or a third gate G3. The second transistor 618 may include a seventh terminal K4, an eighth terminal connected with the first power supply voltage VDD, and/or a fourth gate G4. The sixth terminal K3 may correspond to the reference bit line connection node.

The current mirror may be connected between the third terminal K2 and the seventh terminal K4. The current mirror may include a third transistor 622 and/or a fourth transistor 624. The third transistor 622 may be connected between the third terminal K2 and a second power supply voltage VSS. The fourth transistor 624 may be connected between the seventh terminal K4 and the second power supply voltage VSS. A gate of the third transistor 622, a gate of the fourth transistor 624, and/or a drain of the fourth transistor 624 may be connected in common.

The first comparator 632 may compare the first reference voltage Vref1 with a voltage VBL1 of the second terminal K1 and may output a comparison result to the first gate G1 and/or the second gate G2.

The second comparator 634 may compare the second reference voltage Vref2 with a voltage VRBL1 of the sixth terminal K3 and/or output a comparison result to the third gate G3 and/or the fourth gate G4.

The first and/or second transistors 614 and/or 618 and/or the current mirror (622, 624) may convert voltages V1 and/or V2, which may be respectively output from the comparators 632 and/or 634, into a current signal, thereby generating a current signal.

The sense amplifier 640 may sense and/or amplify data stored in the first cell MC based on a current I2 flowing in the first transistor 614 and/or a current I5 or I4 flowing in the current mirror (622, 624). The current I2 flowing in the first transistor 614 may be a result of mirroring a current I1 flowing in the first load transistor 612. The current I4 or I5 flowing in the current mirror (622, 624) may be a result of mirroring a current I3 flowing in the second load transistor 616. The sense amplifier 640 may be a single-ended sense amplifier.

The read operation of the sense amplifying circuit 600 will be described below. It may be assumed that the first and/or second load transistors 612 and/or 616 and/or the first and/or second transistors 614 and/or 618 may be PMOS transistors and/or the third and/or fourth transistors 622 and/or 624 included in the current mirror may be NMOS transistors.

During the read operation of the sense amplifying circuit 600, the first column transistor 605, the first reference column transistor 607, the first cell, e.g., the first memory cell, MC, and/or the second cell, e.g., the first reference memory cell, RMC may be enabled in response to control signals COL0, RCOL0, WL0, and/or RWL0, respectively. When the first bit line voltage VBL1 is lower than the first reference voltage Vref1, the first load transistor 612 and/or the first transistor 614 may be turned on in response to the output voltage V1 of the first comparator 632. The first current I1 may flow in the first load transistor 612 based on a data value stored in the first cell MC and/or may be mirrored so that the second current I2 may flow in the first transistor 614.

When the first current I1 is applied to the first bit line BL0, the first bit line voltage VBL1 may be increased. When the first bit line voltage VBL1, e.g., the voltage of the first bit line BL0 is higher than the first reference voltage Vref1, the first load transistor 612 may be turned off and/or the first bit line voltage VBL1 may be clamped to the first reference voltage Vref1.

Due to the clamping of the first bit line voltage VBL1, the swing of the first bit line voltage VBL1 may be clamped below the first reference voltage Vref1. The output voltage V1 of the first comparator 632 may be input to the first gate G1 and/or the second gate G2, and the second current I2 may be controlled based on the output voltage V1 of the first comparator 632.

In the same manner, the second bit line voltage, e.g., a sixth terminal's voltage, VRBL1 may be clamped below the second reference voltage Vref2 by the second comparator 634. The third current I3 may be mirrored based on the output voltage V2 of the second comparator 634 so that the fourth current I4 flows in the second transistor 618. The second reference voltage Vref2 may be equal to the first reference voltage Vref1.

The fifth current I5 may be generated by the current mirror (622, 624) mirroring the fourth current I4.

The sense amplifier 640 may sense and amplify a data value stored in the first cell MC based on the second current I2 and/or the fifth current I5. Due to the clamping operation, the swing width of the first bit line voltage VBL1 and/or the second bit line voltage VRBL1 may be reduced, and a current flowing in the first cell MC and/or a current flowing in the second cell RMC may be more quickly sensed. Because the first bit line voltage VBL1 may be maintained below the first reference voltage Vref1 and/or the second bit line voltage VRBL1 may be maintained below the second reference voltage Vref2 regardless of the change of the first power supply voltage VDD, the current flowing in the first cell MC and/or the current flowing in the second cell RMC may be easily secured.

The first power supply voltage VDD required to operate the sense amplifying circuit 600 may be at least the sum of a voltage (e.g., Vdsp=0.2) between a drain and a source of the first load transistor 612 and a voltage required for the first bit line BL0 (e.g., VBL=0.5), e.g., Vdsp+VBL1=0.7. Accordingly, the sense amplifying circuit 600 may operate with the first power supply voltage VDD of 1 V or less.

Figure 7:
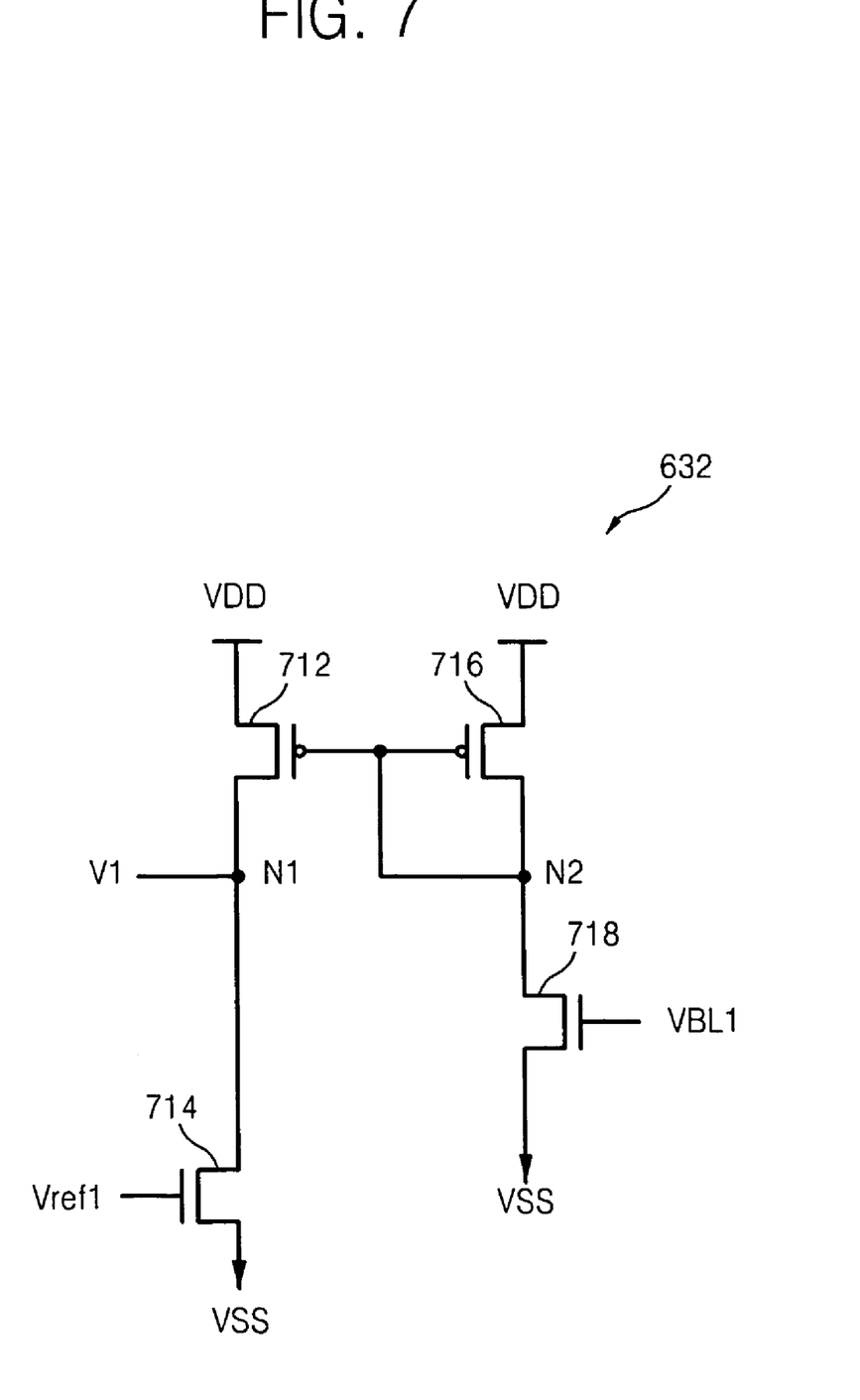
FIG. 7 illustrates a first comparator illustrated in FIG. 6.

FIG. 7 illustrates the first comparator 632 of example embodiments illustrated in FIG. 6. Referring to FIG. 7, the first comparator 632 may include fifth through eighth transistors 712, 714, 716, and/or 718.

The fifth transistor 712 may be connected between a first node N1 and the first power supply voltage VDD. The sixth transistor 714 may be connected between the first node N1 and the second power supply voltage VSS. The seventh transistor 716 may be connected between a second node N2 and the first power supply voltage VDD. The eighth transistor 718 may be connected between the second node N2 and the second power supply voltage VSS.

A gate of the fifth transistor 712, a gate of the seventh transistor 716, and/or a drain of the eighth transistor 718 (or the second node N2) may be connected in common.

The first node N1 may be an output node of the first comparator 632. Accordingly, the first node N1 may be connected with the first gate G1 and/or the second gate G2.

A gate of the sixth transistor 714 and/or a gate of the eighth transistor 718 may be input terminals of the first comparator 632. Accordingly, the first reference voltage Vref1 may be input to the gate of the sixth transistor 714. The gate of the eighth transistor 718 may be connected with the second terminal K1 and/or the first bit line voltage VBL1 at the second terminal K1 may be input to the gate of the eighth transistor 718.

The second comparator 634 may have the same structure as the first comparator 632 with the exception of an input and/or an output. Accordingly, the first node N1 of the second comparator 634 may be connected with the third gate G3 and/or the fourth gate G4. In the second comparator 634, the second reference voltage Vref2 may be input to the gate of the sixth transistor 714, the gate of the eighth transistor 718 may be connected with the sixth terminal K3, and/or the second bit line voltage VRBL1 at the sixth terminal K3 may be input to the gate of the eighth transistor 718.

The fifth transistor 712 and/or the seventh transistor 716 may be PMOS transistors and/or the sixth transistor 714 and/or the eighth transistor 718 may be NMOS transistors. The first comparator 632 and/or the second comparator 634 may operate when the first power supply voltage VDD is 1 V because, for example, the fifth transistor 712 (e.g., a PMOS transistor) needs about 0.5 V for operation and the sixth transistor 714 (e.g., an NMOS transistor) needs about 0.2 V for operation.

Figure 8:
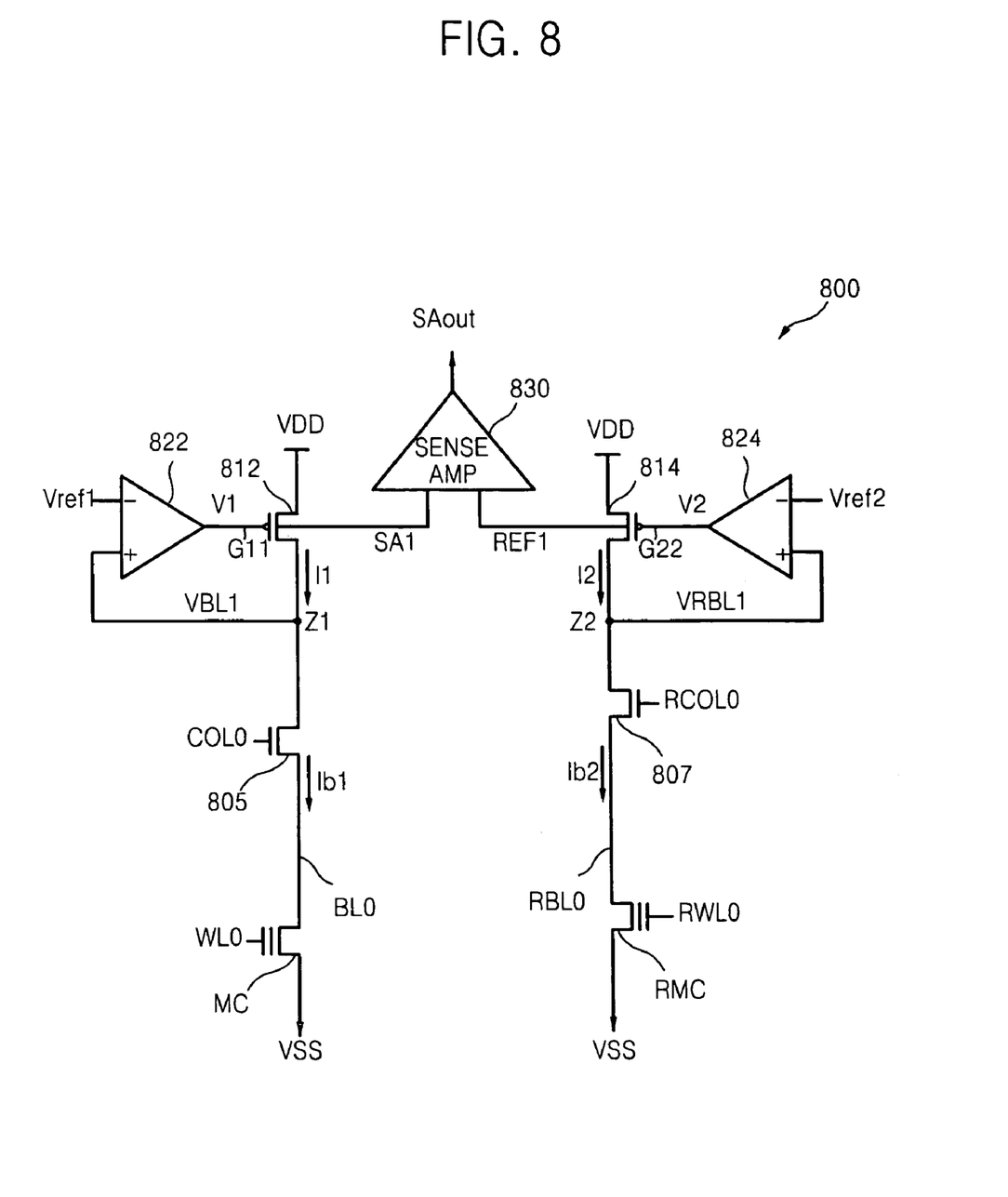
FIG. 8 illustrates a sense amplifying circuit for a nonvolatile memory device according to an example embodiment.

FIG. 8 illustrates a sense amplifying circuit 800 according to an example embodiment. The sense amplifying circuit 800 may be for a nonvolatile memory device. Referring to FIG. 8, the sense amplifying circuit 800 may compare the current Ib1 flowing in the first bit line BL0, connected with the first cell MC with the current Ib2 flowing in the second bit line RBL0 connected with the second cell RMC and/or sense and amplify data stored in the first cell MC.

The sense amplifying circuit 800 may include a controller and/or a sense amplifier 830. The controller may include a first load transistor 812, a second load transistor 814, a first comparator 822, and/or a second comparator 824.

The sense amplifying circuit 800 illustrated in FIG. 8 may be different from the sense amplifying circuit 600 illustrated in FIG. 6 in that the sense amplifying circuit 800 need not include a circuit (for example, corresponding to the first and/or second transistors 614 and/or 618 illustrated in FIG. 6) for converting the output voltages V1 and/or V2 of the comparators 822 and/or 824 into current and/or the current mirror (622, 624), but the sense amplifier 830 may receive the output voltages V1 and/or V2 of the comparators 822 and/or 824. For example, the sense amplifier 830 may sense and/or amplify a difference between the output voltages V1 and/or V2 of the comparators 822 and/or 824, thereby sensing and/or amplifying data stored in the first cell MC.

The first load transistor 812 may include a first terminal connected with the first power supply voltage VDD, a second terminal Z1 selectively connected with the first bit line BL0, and/or a first gate G11. The second load transistor 814 may include a third terminal connected with the first power supply voltage VDD, a fourth terminal Z2 selectively connected with the second bit line RBL0, and/or a second gate G22. The second terminal Z1 and/or the fourth terminal Z2 may correspond to the bit line connection node and/or the reference bit line connection node, respectively.

A first column transistor 805 and/or a first reference column transistor 807 may be selectively enabled in response to the control signals COL0 and/or RCOL0, so that the first bit line BL0 may be selectively connected with the second terminal Z1 and/or the second bit line, e.g., reference bit line RBL0 may be selectively connected with the fourth terminal Z2.

The first comparator 822 may compare the first reference voltage Vref1 with a voltage at the second terminal Z1, e.g., the first bit line voltage VBL1 and/or may output a comparison result V1 to the first gate G11 and/or a sense terminal SA1.

The second comparator 824 may compare the second reference voltage Vref2 with a voltage at the fourth terminal Z2, e.g., the second bit line voltage VRBL1 and may output a comparison result V2 to the second gate G22 and/or a reference terminal REF1.

The sense amplifier 830 may sense and/or amplify data stored in the first cell MC based on the voltage V1 at the sense terminal SA1 and/or the voltage V2 at the reference terminal REF1.

The first and/or second comparators 822 and/or 824 illustrated in FIG. 8 may have the same structure as the first comparator 632 illustrated in FIG. 7 with the exception of an input and/or an output.

Referring to FIGS. 7 and 8, in the first comparator 822 illustrated in FIG. 8, the first node N1 may be an output node of the first comparator 822. Accordingly, the first node N1 may be connected with the first gate G11 and/or the sense terminal SA1. The gate of the sixth transistor 714 and/or the gate of the eighth transistor 718 may be input terminals of the first comparator 822. Accordingly, the first reference voltage Vref1 may be input to the gate of the sixth transistor 714. The gate of the eighth transistor 718 may be connected with the second terminal Z1 and/or the first bit line voltage VBL1 may be input to the gate of the eighth transistor 718.

In the second comparator 824 illustrated in FIG. 8, the first node N1 may be connected with the second gate G22 and/or the reference terminal REF1. The second reference voltage Vref2 may be input to the gate of the sixth transistor 714. The gate of the eighth transistor 718 may be connected with the fourth terminal Z2 and/or the second bit line voltage VRBL1 may be input to the gate of the eighth transistor 718.

The operation of the sense amplifying circuit 800 of example embodiments illustrated in FIG. 8 will be described below. It may be assumed that the first load transistor 812 and/or the second load transistor 814 may be PMOS transistors.

During the read operation of the sense amplifying circuit 800, the first column transistor 805, the first reference column transistor 807, the first cell, e.g., the first memory cell, MC, and/or the second cell, e.g., the first reference memory cell, RMC may be enabled in response to the control signals COL0, RCOL0, WL0, and/or RWL0, respectively. When the first bit line voltage VBL1 may be lower than the first reference voltage Vref1, the first load transistor 812 may be turned on in response to the output voltage V1 of the first comparator 822. The first current I1 may flow in the first load transistor 812 based on a data value stored in the first cell MC. The second current I2 may flow in the second load transistor 814 based on a data value stored in the second cell RMC.

When the first current I1 is applied to the first bit line BL0, the first bit line voltage VBL1 may be increased. When the first bit line voltage VBL1 is higher than the first reference voltage Vref1, the first load transistor 812 may be turned off and/or the first bit line voltage VBL1 may be clamped to the first reference voltage Vref1. Due to the clamping of the first bit line voltage VBL1, the swing of the first bit line voltage VBL1 may be clamped below the first reference voltage Vref1. In the same manner, the second bit line voltage VRBL1 may be clamped below the second reference voltage Vref2.

The sense amplifier 830 may compare the output voltage V1 of the first comparator 822 with the output voltage V2 of the second comparator 824 and/or sense and/or amplify data stored in the first cell MC. In the sense amplifying circuit 800 of example embodiments, the change of the first bit line voltage VBL1 caused by the change of the current Ib1 flowing in the first bit line BL0 may be amplified and may appear in the output voltage V1 of the first comparator 822, and/or the sense amplifier 830 may more quickly sense a current flowing in the first cell MC.

The sense amplifying circuit 800 of example embodiments may operate even when the first power supply voltage VDD is 1 V.

Figure 9:
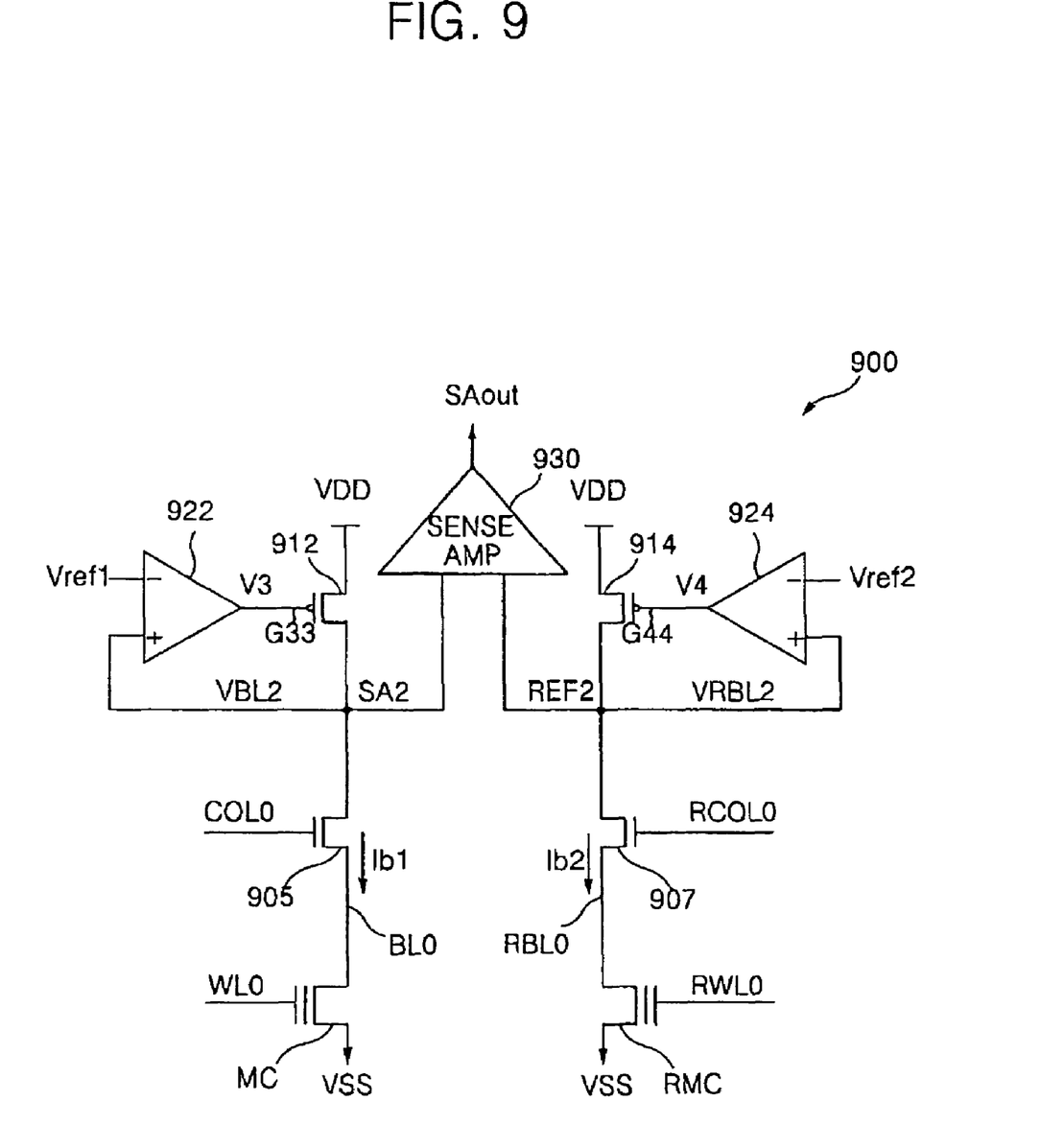
FIG. 9 illustrates a sense amplifying circuit for a nonvolatile memory device according to an example embodiment.

FIG. 9 illustrates a sense amplifying circuit 900 according to an example embodiment. The sense amplifying circuit 900 may be for a nonvolatile memory device. Referring to FIG. 9, the sense amplifying circuit 900 may compare the first current Ib1 flowing in the first bit line BL0 connected with the first cell MC with the second current Ib2 flowing in the second bit line RBL0 connected with the second cell RMC and/or sense and/or amplify data stored in the first cell MC.

The sense amplifying circuit 900 may include a controller and/or a sense amplifier 930. The controller may include a first load transistor 912, a second load transistor 914, a first comparator 922, and/or a second comparator 924.

The sense amplifying circuit 900 illustrated in FIG. 9 may be different from the sense amplifying circuit 800 illustrated in FIG. 8 in that the sense amplifier 930 may receive the voltage from the sense node SA2 and/or the reference node REF2 instead of the output voltages V1 and/or V2 from the comparators 922 and/or 924. For example, the sense amplifier 930 may sense and amplify a voltage difference between the sense node SA2 and the reference node REF2, thereby sensing and/or amplifying the data stored in the first cell MC.

A first column transistor 905 and/or a first reference column transistor 907 may be selectively enabled in response to the control signals COL0 and/or RCOL0, respectively, so that the first bit line BL0 may be selectively connected with the sense node SA2 and/or the second bit line (e.g., the reference bit line) RBL0 may be selectively connected with the reference node REF2.

The first load transistor 912 may include a fifth terminal connected with the first power supply voltage VDD, a sixth terminal selectively connected with the sense node SA2, and/or a third gate G33. The second load transistor 914 may include a seventh terminal connected with the first power supply voltage VDD, an eighth terminal selectively connected with the reference node REF2, and/or a fourth gate G44.

The first comparator 922 may compare the first reference voltage Vref1 with the voltage of the sense node SA2, e.g., a first bit line voltage VBL2 and may output a comparison result to the third gate G33. The second comparator 924 may compare the second reference voltage Vref2 with the voltage of the reference node REF2, e.g., a second bit line voltage VRBL2 and may output a comparison result to the fourth gate G44.

The first and/or second comparators 922 and/or 924 illustrated in FIG. 9 may have the same structure as the first comparator 632 illustrated FIG. 7 with the exception of an input and/or an output.

Referring to FIGS. 7 and 9, in the first comparator 922 illustrated in FIG. 9, the first node N1 may be connected with the first gate G33. The first reference voltage Vref1 may be input to the gate of the sixth transistor 714. The gate of the eighth transistor 718 may be connected with the sense node SA2. The first bit line voltage VBL2 may be input to the gate of the eighth transistor 718.

The sense amplifier 930 may compare the voltage of the sense node SA2 with the voltage of the reference node REF2 and/or sense and/or amplify data stored in the first cell MC based on a comparison result.

The voltage of the sense node SA2 and the voltage of the reference node REF2 may be clamped below the first reference voltage Vref1 and/or the second reference voltage Vref2, respectively, in the operation of the sense amplifying circuit 900. However, the input voltages of the sense amplifier 930 may not be the output voltages V3 and/or V4 of the first and/or second comparators 922 and/or 924 but the first bit line voltage VBL2 and/or the second bit line voltage VRBL2. Accordingly, the sense amplifying circuit 900 may be slower than the sense amplifying circuit 800 illustrated in FIG. 8 in sensing the data stored in the first cell MC.

Figure 10:
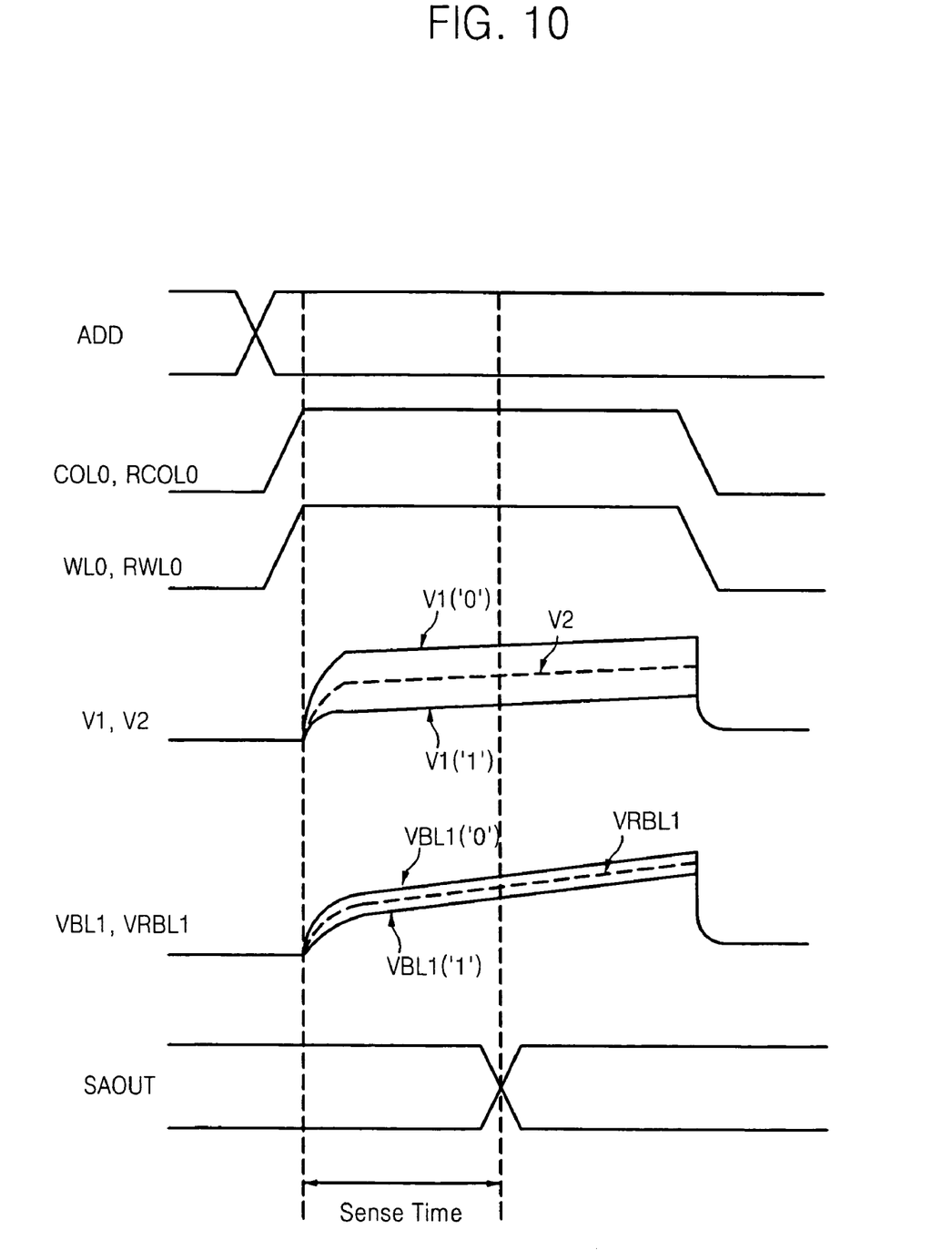
FIG. 10 is an example timing chart of the operation of the sense amplifying circuits illustrated in FIGS. 6 and 8.

FIG. 10 is an example timing chart of the operation of the sense amplifying circuits 600 and 800 of example embodiments illustrated in FIGS. 6 and 8. Referring to FIG. 10, when the control signals COL0, RCOL0, WL0, and/or RWL0 transit to a logic high level based on the address signal ADD, the first column transistor 605 or 805 and/or the first reference column transistor 607 or 807 may be enabled and/or the first cell MC and/or the second cell RMC may be selected.

The swing width of the voltage of the first bit line BL0 connected with the first cell MC, e.g., the first bit line voltage VBL1 may be decreased due to the clamping operation of the first comparator 632. The first comparator 632 may amplify the first bit line voltage VBL1 and may output the amplified voltage V1.

Accordingly, the output voltages V1 and/or V2 of the first comparator 632 or 822 and/or the second comparator 634 or 824 may be changed even by a smaller change of the first bit line voltage VBL1 and/or the second bit line voltage VRBL1. Accordingly, the sense amplifier 640 or 830 may quickly sense data. For example, when the first bit line voltage VBL1 is higher than the second bit line voltage VRBL1, the sense amplifying circuit 600 or 800 may sense the first cell MC as an erased cell having a data value of "0". When the first bit line voltage VBL1 may be lower than the second bit line voltage VRBL1, the sense amplifying circuit 600 or 800 may sense the first cell MC as a programmed cell having a data value of "1".

According to an example embodiment, a nonvolatile memory device may include a nonvolatile memory cell array including a first bit line connected with a first memory cell and a second bit line connected with a first reference memory cell and the sense amplifying circuit 600, 800, or 900. The comparators 632 and/or 634, 822 and/or 824, or 922 and/or 924 included in the sense amplifying circuit 600, 800, or 900 of example embodiments may have the same structure as that illustrated in FIG. 7 with the exception of an input and/or an output.

As described above, according to example embodiments, a sense amplifying circuit and/or a nonvolatile memory device including the same may operate with a power supply voltage of 1V or less, increase read speed, secure stable current for nonvolatile memory cells, and/or remove disturbance that may occur in the nonvolatile memory cells.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. A sense amplifying circuit comprising:
   a controller configured to control a current flowing in a first bit line connected with a first cell based on a first reference voltage and to control a current flowing in a second bit line connected with a second cell based on a second reference voltage; and
   a sense amplifier configured to sense data stored in the first cell based on the current flowing in the first bit line and the current flowing in the second bit line,
   wherein the controller controls the current flowing in the first bit line based on a comparison result of the first reference voltage and a voltage generated based on the data stored in the first cell; and
   wherein the controller controls the current flowing in the second bit line based on a comparison result of the second reference voltage and a voltage generated based on a data stored in the second cell.

2. The sense amplifying circuit of claim 1, wherein the controller includes
   a bit line connection node selectively connected with the first bit line;
   a reference bit line connection node selectively connected with the second bit line;
   a first comparator configured to compare a voltage of the bit line connection node with the first reference voltage and to output a first comparison signal;
   a second comparator configured to compare a voltage of the reference bit line connection node with the second reference voltage and to output a second comparison signal;
   a first load transistor connected between a first power supply voltage and the bit line connection node and controlled by the first comparison signal; and
   a second load transistor connected between the first power supply voltage and the reference bit line connection node and controlled by the second comparison signal.

3. The sense amplifying circuit of claim 2, wherein the controller further includes
   a current generation circuit configured to generate a first current signal based on a voltage of the first comparison signal and to generate a second current signal based on a voltage of the second comparison signal, and
   wherein the sense amplifier senses the data stored in the first cell based on the first current signal and the second current signal.

4. The sense amplifying circuit of claim 3, wherein the current generation circuit includes
   a first transistor connected between the first power supply voltage and a first node, wherein the first transistor includes a gate receiving the first comparison signal,
   a second transistor connected between the first power supply voltage and a second node, wherein the second transistor includes a gate receiving the second comparison signal,
   a third transistor connected between the first node and a second power supply voltage, and
   a fourth transistor connected between the second node and the second power supply voltage,
   wherein a gate of the third transistor, a gate of the fourth transistor, and a drain of the fourth transistor are connected in common;
   wherein a current flowing in the first transistor corresponds to the first current signal and a current flowing in the second transistor corresponds to the second current signal; and
   wherein the sense amplifier receives a signal from the first node.

5. The sense amplifying circuit of claim 2, wherein the sense amplifier senses and amplifies a voltage difference between the first comparison signal and the second comparison signal.

6. The sense amplifying circuit of claim 2, wherein the sense amplifier senses and amplifies a difference between a voltage of the bit line connection node and a voltage of the reference bit line connection node.

7. The sense amplifying circuit of claim 2, wherein each of the first and second comparators includes
   a first transistor connected between a first node and the first power supply voltage,
   a second transistor connected between the first node and a second power supply voltage,
   a third transistor connected between a second node and the first power supply voltage, and
   a fourth transistor connected between the second node and the second power supply voltage,
   wherein a gate of the first transistor, a gate of the third transistor, and a drain of the third transistor are connected in common,
   wherein the first comparison signal is output through the first node of the first comparator, a gate of the fourth transistor of the first comparator is connected with the bit line connection node, and the first reference voltage is input to a gate of the second transistor of the first comparator, and
   wherein the second comparison signal is output through the first node of the second comparator, a gate of the fourth transistor of the second comparator is connected with the reference bit line connection node, and the second reference voltage is input to a gate of the second transistor of the second comparator.

8. A nonvolatile memory device comprising:
   the sense amplifying circuit of claim 1; and a nonvolatile memory cell array including the first bit line connected with the first cell and the second bit line connected with the second cell, wherein the first cell is a first memory cell and the second cell is a first reference memory cell.

9. The nonvolatile memory device of claim 8, wherein the controller includes
a bit line connection node selectively connected with the first bit line;
a reference bit line connection node selectively connected with the second bit line;
a first comparator configured to compare a voltage of the bit line connection node with the first reference voltage and to output a first comparison signal;
a second comparator configured to compare a voltage of the reference bit line connection node with the second reference voltage and to output a second comparison signal;
a first load transistor connected between a first power supply voltage and the bit line connection node and controlled by the first comparison signal; and
a second load transistor connected between the first power supply voltage and the reference bit line connection node and controlled by the second comparison signal.

10. The nonvolatile memory device of claim 9, wherein the sense amplifier is configured to sense the data stored in the first memory cell based on a voltage of the bit line connection node and a voltage of the reference bit line connection node.

11. The nonvolatile memory device of claim 9, wherein the sense amplifier is configured to sense the data stored in the first memory cell based on a voltage of the first comparison signal and the second comparison signal.

12. The nonvolatile memory device of claim 9, wherein the controller further includes
a current generation circuit configured to generate a first current signal based on a voltage of the first comparison signal and to generate a second current signal based on a voltage of the second comparison signal, and
wherein the sense amplifier senses the data stored in the first cell based on the first current signal and the second current signal.

13. The nonvolatile memory device of claim 12, wherein the current generation circuit includes
a first transistor connected between the first power supply voltage and a first node, wherein the first transistor includes a gate receiving the first comparison signal,
a second transistor connected between the first power supply voltage and a second node, wherein the second transistor includes a gate receiving the second comparison signal,
a third transistor connected between the first node and a second power supply voltage, and
a fourth transistor connected between the second node and the second power supply voltage;
wherein a gate of the third transistor, a gate of the fourth transistor, and a drain of the fourth transistor are connected in common;
wherein a current flowing in the first transistor corresponds to the first current signal and a current flowing in the second transistor corresponds to the second current signal; and
wherein the sense amplifier receives a signal from the first node.

14. The nonvolatile memory device of claim 9, wherein the sense amplifier senses and amplifies a voltage difference between the first comparison signal and the second comparison signal.

15. The nonvolatile memory device of claim 9, wherein the sense amplifier senses and amplifies a difference between the voltage of the bit line connection node and the voltage of the reference bit line connection node.

16. The nonvolatile memory device of claim 9, further comprising:
a column transistor configured to selectively connect the bit line connection node with the first bit line in response to a first control signal; and
a reference column transistor configured to selectively connect the reference bit line connection node with the second bit line in response to a second control signal.

17. The nonvolatile memory device of claim 8, wherein the nonvolatile memory device is a NOR flash memory device.

18. A method of operating a sense amplifying circuit comprising:
controlling a current flowing in a first bit line connected with a first cell based on a comparison result of a first reference voltage with a voltage generated based on a data stored in the first cell,
controlling a current flowing in a second bit line connected with a second cell based on a comparison result of a second reference voltage with a voltage generated based on a data stored in the second cell, and
sensing the data stored in the first cell based on the current flowing in the first bit line and the current flowing in the second bit line.

19. The method of claim 18, further comprising:
comparing a voltage of a bit line connection node selectively connected with the first bit line with the first reference voltage to output a first comparison signal,
comparing a voltage of a reference bit line connection node selectively connected with the second bit line with the second reference voltage to output a second comparison signal,
controlling a first load transistor connected between a first power supply voltage and the bit line connection node with the first comparison signal, and
controlling a second load transistor connected between the first power supply voltage and the reference bit line connection node with the second comparison signal.

20. The method of claim 19, further comprising:
generating a first current signal based on a voltage of the first comparison signal, and
generating a second current signal based on a voltage of the second comparison signal, wherein the sensing of the data stored in the first cell is based on the first current signal and the second current signal.

21. The method of claim 19, further comprising:
sensing and amplifying a voltage difference between the first comparison signal and the second comparison signal.

22. The method of claim 19, further comprising:
sensing and amplifying a difference between a voltage of the bit line connection node and a voltage of the reference bit line connection node.

* * * * *